United States Patent
Maeda

(10) Patent No.: US 7,580,116 B2
(45) Date of Patent: Aug. 25, 2009

(54) EXPOSURE APPARATUS AND DEVICE FABRICATION METHOD

(75) Inventor: Hironori Maeda, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 12/168,341

(22) Filed: Jul. 7, 2008

(65) Prior Publication Data

US 2009/0015813 A1    Jan. 15, 2009

(30) Foreign Application Priority Data

Jul. 9, 2007    (JP) .............................. 2007-180155

(51) Int. Cl.
*G03B 27/74*    (2006.01)
*G03B 27/42*    (2006.01)

(52) U.S. Cl. .......................................... 355/68; 355/53

(58) Field of Classification Search .................. 355/52, 355/53, 55, 67–71; 250/548; 356/399–401
See application file for complete search history.

(56) References Cited

U.S. PATENT DOCUMENTS 5,654,553 A * 8/1997 Kawakubo et al. .......... 250/548
6,337,162 B1 * 1/2002 Irie ................................ 430/5
6,999,893 B2 * 2/2006 Matsumoto et al. ......... 702/150
2003/0053057 A1 * 3/2003 Mishima ..................... 356/401

FOREIGN PATENT DOCUMENTS

JP    09-167738 A    6/1997

* cited by examiner

*Primary Examiner*—Hung Henry Nguyen
(74) *Attorney, Agent, or Firm*—Rossi, Kimms & McDowell LLP

(57) ABSTRACT

The present invention provides an exposure apparatus including a position detection apparatus that detects at least one of a position of a reticle and a position of a substrate. The position detection apparatus includes an optical member whose position can be changed, a photoelectric conversion device that receives light from a mark and outputs a detection signal, and a control unit that controls the position of the optical member based on information on a first evaluation value representing a symmetry of a waveform of the detection signal at each of a plurality of positions of the optical member and information on a second evaluation value representing a position shift of the mark detected upon changing a position of the mark in an optical axis direction of an optical system at each of the plurality of positions of the optical member.

7 Claims, 13 Drawing Sheets

FIG. 12
DEFOCUS (+)
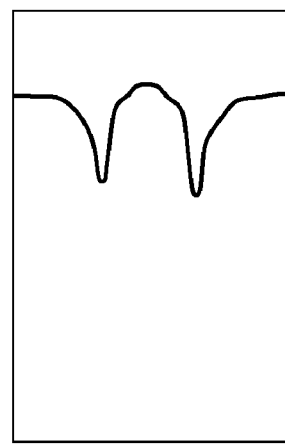 a
BEST FOCUS
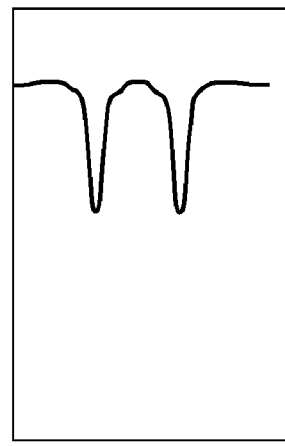 b
DEFOCUS (−)
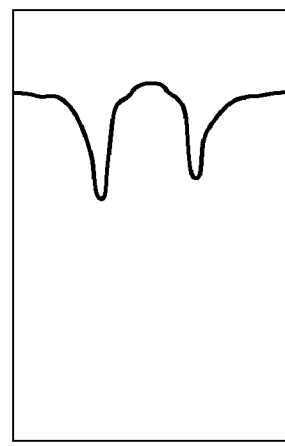 c

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

A projection exposure apparatus which projects and transfers a circuit pattern drawn on a reticle (mask) onto, for example, a wafer via a projection optical system has conventionally been employed to fabricate a semiconductor device using photolithography.

Along with the micropatterning of semiconductor devices, the projection exposure apparatus is required to transfer a reticle pattern onto a wafer by exposure with a higher resolving power. A minimum line width (resolution) that the projection exposure apparatus can transfer is proportional to the wavelength of exposure light and is inversely proportional to the numerical aperture (NA) of the projection optical system. In view of this, the wavelength of the exposure light is shortening and the NA of the projection optical system is increasing.

An exposure light source has currently shifted from a superhigh pressure mercury lamp (i-line (wavelength: about 365 nm)) to a KrF excimer laser (wavelength: about 248 nm) and an ArF excimer laser (wavelength: about 193 nm), and the practical application of even an $F_2$ laser (wavelength: about 157 nm) is in progress. Moreover, the adoption of EUV (Extreme Ultra Violet) light with a wavelength of about 10 nm to 15 nm is expected.

There has also been proposed immersion exposure that aims at increasing the NA of the projection optical system by filling at least part of the space between the projection optical system and the wafer with a liquid (e.g., a liquid with a refractive index higher than 1). The immersion exposure improves the resolution by increasing the NA of the projection optical system on the wafer side.

Along with such an improvement in resolution, the projection exposure apparatus is also required to improve the overlay accuracy, that is, the accuracy of overlaying several patterns on the wafer. In general, the overlay accuracy must be about ⅓ the resolution. Along with the micropatterning of semiconductor devices, it is increasingly becoming important to improve the overlay accuracy. To obtain a desired overlay accuracy, it is necessary to align the reticle and wafer with high accuracy. For this purpose, the projection exposure apparatus includes a plurality of alignment detection systems (i.e., position detection apparatuses).

Wafer alignment detection systems are roughly classified into two, that is, the off-axis detection system and the TTL-AA (Through the Lens Auto Alignment) detection system. The off-axis detection system detects an alignment mark on the wafer without using a projection optical system. The TTL-AA detection system detects an alignment mark on the wafer with the alignment wavelength of non-exposure light via a projection optical system.

In recent years, the semiconductor device production mode is shifting from low-variety, high-volume production to high-variety, low-volume production. Along with this trend, an alignment detection system which can minimize detection errors in wafer processes under various conditions (with regard to, e.g., the material, thickness, film thickness, and line width) is demanded. For example, when the alignment detection system includes a TIS (Tool Induced Shift), it generates detection errors even when it detects an alignment mark with a symmetrical stepped structure. Detection errors are generated due to aberrations (especially, coma aberration due to decentering) which cause the TIS and remain in the optical system of the alignment detection system, and the tilt (optical axis shift) of the optical axis of this optical system. To provide an alignment detection system which can minimize detection errors in wafer processes under various conditions, it is necessary to reduce coma aberration and an optical axis shift of the optical system of the alignment detection system.

Coma aberration of the alignment detection system is often reduced by moving an optical member of the alignment detection system (adjusting the optical center of gravity) so that an asymmetrical waveform obtained upon detecting an adjustment mark becomes symmetrical. See Japanese Patent Laid-Open No. 9-167738 for details of this technique. Then, an alignment mark (chromium pattern) included in the exposure apparatus is detected in each defocus state, and the alignment detection system is adjusted so that the detection position (defocus characteristic) of an image of the alignment mark falls within a predetermined range (specification).

However, the prior art adjusts the alignment detection system so that coma aberration and an optical axis shift of the optical system of the alignment detection system are canceled in total. In other words, the prior art does not reduce coma aberration and an optical axis shift of the optical system of the alignment detection system to zero.

A waveform obtained upon detecting the adjustment mark becomes asymmetrical not only due to the influence of coma aberration but also due to the influence of an optical axis shift. In some cases, even when the alignment detection system is adjusted so that the waveform symmetry falls within a predetermined range (specification), an asymmetrical waveform component due to an optical axis shift is merely canceled by the influence of coma aberration, so the coma aberration and optical axis shift, in fact, remain in the alignment detection system. When the alignment detection system is adjusted so that the defocus characteristic as an index of an optical axis shift of the wafer alignment detection system satisfies a specification while the coma aberration and optical axis shift remain in the alignment detection system, the waveform symmetry may deteriorate, resulting in detection errors.

The alignment detection system detects the alignment mark by selecting a wavelength range, in which the contrast of the detection waveform is highest, for each wafer process. If a certain wafer process cannot obtain a required contrast in wavelength ranges provided to the alignment detection system, a new wavelength range in which a required contrast is obtained is sometimes additionally set for it. When a new wavelength range is additionally set for the alignment detection system, it is necessary to adjust the alignment detection system so that the defocus characteristic in the new wavelength range satisfies a specification. However, even in this case, when the alignment detection system is adjusted so that the defocus characteristic in the new wavelength range satisfies the specification, the waveform symmetry may deteriorate, resulting in detection errors.

SUMMARY OF THE INVENTION

The present invention provides an exposure apparatus having a position detection apparatus which can improve the detection accuracy by reducing detection errors in wafer processes under various conditions.

According to one aspect of the present invention, there is provided an exposure apparatus comprises a projection optical system configured to project a pattern of a reticle onto a substrate, and a position detection apparatus configured to detect at least one of a position of the reticle and a position of the substrate, the position detection apparatus including an optical system which includes an optical member whose position can be changed, a photoelectric conversion device configured to receive light from a mark to detect the position of the reticle and the position of the substrate via the optical system, and configured to output a detection signal, and a control unit configured to control the position of the optical member based on information on a first evaluation value representing a symmetry of a waveform of the detection signal at each of a plurality of positions of the optical member, and information on a second evaluation value representing a position shift of the mark detected upon changing a position of the mark in an optical axis direction of the optical system at each of the plurality of positions of the optical member, wherein the control unit includes the information on the first evaluation value in advance.

According to another aspect of the present invention, there is provided a device fabrication method comprises steps of exposing a substrate using the above exposure apparatus, and performing a development process for the substrate exposed.

Further features of the present invention will become apparent from the following description of exemplary embodiments with reference to the attached drawings.

BRIEF DESCRIPTION OF THE DRAWINGS

FIG. 12 shows charts of detection waveforms obtained when the alignment mark has been detected while coma aberration and an optical axis shift remain in the optical system of the wafer alignment detection system although the coma aberration is adjusted so that the detection waveform becomes symmetrical.

DESCRIPTION OF THE EMBODIMENT

Figure 1:
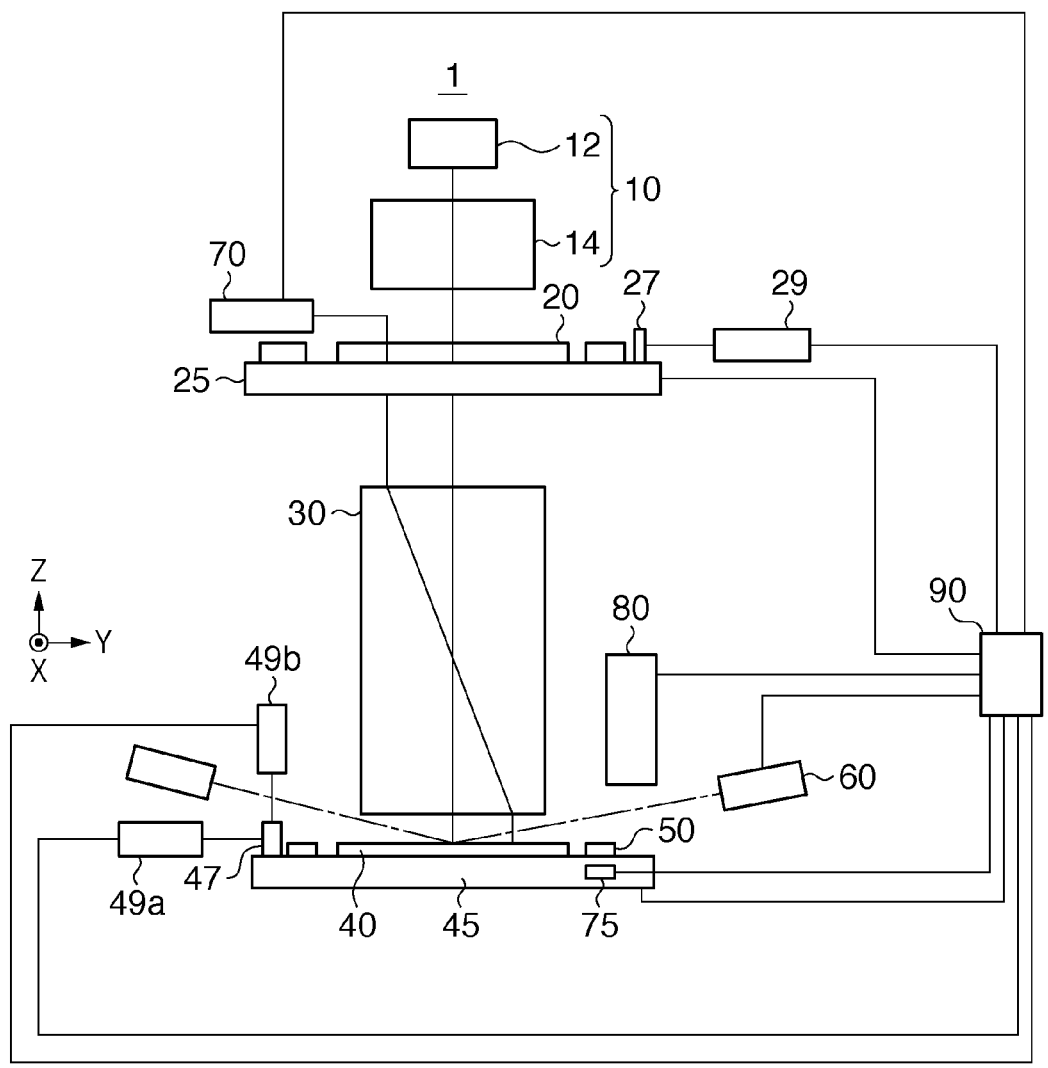
FIG. 1 is a schematic block diagram showing an exposure apparatus according to one aspect of the present invention.

A preferred embodiment of the present invention will be described below with reference to the accompanying drawings. The same reference numerals denote the same members throughout the drawings, and a repetitive description thereof will not be given.

FIG. 1 is a schematic block diagram showing the arrangement of an exposure apparatus 1 according to one aspect of the present invention. In this embodiment, the exposure apparatus 1 is a scanning exposure apparatus (scanner) which transfers the pattern of a reticle 20 onto a wafer 40 by exposure while synchronously scanning the reticle 20 and wafer 40 in the scanning direction. However, the exposure apparatus 1 may be a projection exposure apparatus (stepper) which transfers the pattern of the reticle 20 onto the wafer 40 by exposure while the reticle 20 is fixed.

As shown in FIG. 1, the exposure apparatus 1 includes an illumination apparatus 10, a reticle stage 25 for supporting the reticle 20, a projection optical system 30, and a wafer stage 45 for supporting the wafer 40. The exposure apparatus 1 also includes a stage reference plate 50, focus detection system 60, reticle alignment detection systems 70 and 75, wafer alignment detection system 80, and control unit 90. In the following description, the optical axis direction of the projection optical system 30 is defined as the Z-axis direction, the scanning direction of the reticle 20 and wafer 40 on a plane perpendicular to the Z-axis direction is defined as the Y-axis direction, and a direction (non-scanning direction) perpendicular to the Z- and Y-axis directions is defined as the X-axis direction. The rotation directions about the X-, Y-, and Z-axes are defined as the θX, θY, and θZ directions, respectively.

The illumination apparatus 10 illuminates the reticle 20 on which a circuit pattern to be transferred is formed, and includes a light source 12 and illumination optical system 14.

The light source 12 is, for example, an excimer laser such as a KrF excimer laser with a wavelength of about 248 nm or an ArF excimer laser with a wavelength of about 193 nm. However, the light source 12 is not particularly limited to an excimer laser, and may be, for example, an $F_2$ laser with a wavelength of about 157 nm.

The illumination optical system 14 illuminates the reticle 20 with a light beam from the light source 12. In this embodiment, the illumination optical system 14 illuminates a predetermined illumination region on the reticle 20 with light (exposure light) exhibiting a uniform illuminance distribution.

The reticle 20 has a circuit pattern and is supported and driven by the reticle stage 25. Diffracted light generated by the reticle 20 is projected onto the wafer 40 via the projection optical system 30.

The reticle stage 25 supports the reticle 20. In this embodiment, the reticle stage 25 can finely, two-dimensionally move on a plane perpendicular to the optical axis of the projection optical system 30, that is, on the X-Y plane and can finely rotate in the θZ direction. Although the reticle stage 25 is drivable about at least one axis, it is preferably drivable about six axes. The reticle stage 25 is driven by a reticle stage driving mechanism such as a linear motor.

A mirror 27 is arranged on the reticle stage 25. A laser interferometer 29 for measuring the position of the mirror 27 in the X- and Y-axis directions is arranged to oppose the mirror 27. The rotation angle and position, in the two-dimensional direction, of the reticle 20 supported by the reticle stage 25 are measured in real time by the laser interferometer 29. The measurement result obtained by the laser interferometer 29 is output to the control unit 90.

The projection optical system 30 includes a plurality of optical elements and projects the pattern of the reticle 20 onto the wafer 40 with a predetermined projection magnification β. In this embodiment, the projection optical system 30 is a reduction projection optical system with a projection magnification of, for example, ¼ or ⅕.

The wafer 40 is a substrate onto which the pattern of the reticle 20 is projected (transferred). However, the wafer 40 can be substituted by a glass plate or another substrate. The wafer 40 is coated with a resist (photosensitive agent).

The wafer stage 45 supports and drives the wafer 40. In this embodiment, the wafer stage 45 includes a Z stage for holding the wafer 40 via a wafer chuck, an X-Y stage for supporting the Z stage, and a base for supporting the X-Y stage. The wafer stage 45 is driven by a wafer stage driving mechanism such as a linear motor.

A mirror 47 is arranged on the wafer stage 45. A laser interferometer 49a for measuring the position of the mirror 47 in the X- and Y-axis directions and a laser interferometer 49b for measuring the position of the mirror 47 in the Z-axis direction are arranged to oppose the mirror 47. The position of the wafer stage 45 in the X- and Y-axis directions and θZ direction is measured in real time by the laser interferometer 49a. The position of the wafer stage 45 in the Z-axis direction and θX and θY directions is measured in real time by the laser interferometer 49b. The measurement results obtained by the laser interferometers 49a and 49b are output to the control unit 90.

Figure 2:
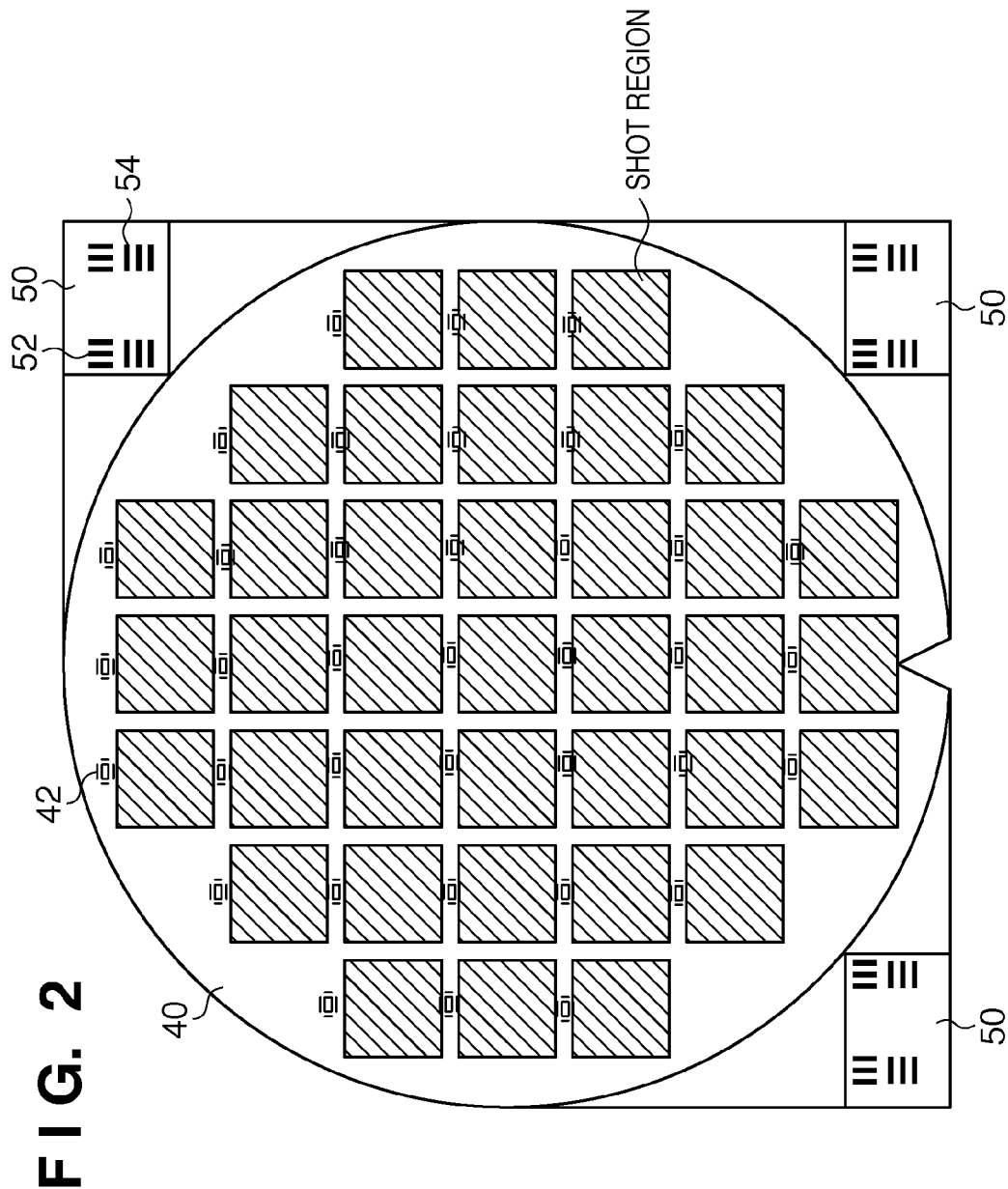
FIG. 2 is a view showing the arrangement of a stage reference plate arranged on a wafer stage of the exposure apparatus shown in FIG. 1.

The stage reference plate 50 is arranged at the corner on the wafer stage 45. FIG. 2 is a view showing the arrangement of the stage reference plate 50 on the wafer stage 45. The stage reference plate 50 is nearly flush with the surface of the wafer 40. As shown in FIG. 2, the stage reference plate 50 includes a reticle alignment detection system reference mark 52 detected by the reticle alignment detection system 70 (or reticle alignment detection system 75). The stage reference plate 50 also includes a wafer alignment detection system reference mark 54 detected by the wafer alignment detection system 80.

The stage reference plate 50 may be arranged at one corner on the wafer stage 45, or stage reference plates 50 may be arranged at a plurality of corners on the wafer stage 45. The stage reference plate 50 may include a plurality of reticle alignment detection system reference marks 52 and a plurality of wafer alignment detection system reference marks 54. A predetermined positional relationship (along the X- and Y-axis directions) is set in advance between the reticle alignment detection system reference mark 52 and the wafer alignment detection system reference mark 54. The reticle alignment detection system reference mark 52 and wafer alignment detection system reference mark 54 may be a common mark.

The focus detection system 60 has a function of detecting the focus (the position in the Z-axis direction) of the wafer 40. In this embodiment, the focus detection system 60 includes a light-projecting system for projecting detection light onto the surface of the wafer 40, and a light-receiving system for receiving the detection light reflected by the surface of the wafer 40. The detection result obtained by the focus detection system 60 is output to the control unit 90.

The reticle alignment detection system 70 is arranged near the reticle stage 25. The reticle alignment detection system 70 detects a reticle reference mark (not shown) on the reticle 20 supported by the reticle stage 25. The reticle alignment detection system 70 also detects, via the projection optical system 30, the reticle alignment detection system reference mark 52 of the stage reference plate 50 arranged on the wafer stage 45.

The reticle alignment detection system 70 irradiates the reticle reference mark and reticle alignment detection system reference mark 52 using the same light source as the light source 12 which actually exposes the wafer 40, and detects the light beams reflected by these marks using a photoelectric conversion device (e.g., a CCD camera). By adjusting the focuses and positions of the reticle reference mark on the reticle 20 and the reticle alignment detection system reference mark 52 on the stage reference plate 50, the relative positional relationship between the reticle stage 25 and the wafer stage 45 can be adjusted to a desired one. The detection result obtained by the reticle alignment detection system 70 is output to the control unit 90.

The reticle alignment detection system 75 is of a transparent type and used when the reticle alignment detection system reference mark 52 is a mark of a transparent type. The reticle alignment detection system 75 irradiates the reticle reference mark and reticle alignment detection system reference mark 52 using the same light source as the light source 12, and detects the light beams transmitted through these marks by a light amount sensor. The reticle alignment detection system 75 detects the amounts of transmitted light beams while driving the wafer stage 45 in the X-axis direction (or Y-axis direction) and Z-axis direction. This makes it possible to adjust the positions and focuses of the reticle reference mark on the reticle 20 and the reticle alignment detection system reference mark 52 on the stage reference plate 50. It is therefore possible to adjust the relative positional relationship between the reticle stage 25 and the wafer stage 45 to a desired one. The detection result obtained by the reticle alignment detection system 75 is output to the control unit 90.

In this manner, either the reticle alignment detection system 70 or 75 can be used to adjust the relative positional relationship between the reticle stage 25 and the wafer stage 45 to a desired one.

The wafer alignment detection system 80 includes a light-projecting system for projecting detection light beams onto a wafer alignment mark 42 on the wafer 40 and the wafer alignment detection system reference mark 54 on the stage reference plate 50, and a light-receiving system for receiving the light beams reflected by these marks. The detection result obtained by the wafer alignment detection system 80 is output to the control unit 90.

The control unit 90 includes a CPU and memory (not shown) and controls the operation of the exposure apparatus 1. The control unit 90 is electrically connected to the reticle stage 25, laser interferometer 29, wafer stage 45, and laser interferometers 49a and 49b. The control unit 90 is also electrically connected to the focus detection system 60, reticle alignment detection system 70 (or reticle alignment detection system 75), and wafer alignment detection system 80.

Based on the measurement result obtained by the laser interferometer 29, the control unit 90 controls the reticle stage 25 (i.e., the reticle stage driving mechanism) to position the reticle 20 supported by the reticle stage 25. Based on the measurement results obtained by the laser interferometers 49a and 49b, the control unit 90 controls the wafer stage 45 (i.e., the wafer stage driving mechanism) to position the wafer 40 supported by the wafer stage 45. Based on the detection result obtained by the focus detection system 60, the control unit 90 adjusts the tilt angle and position (focus position), in the Z-axis direction, of the wafer 40 supported by the wafer stage 45. Based on the detection result obtained by the reticle alignment detection system 70 or 75, the control unit 90 aligns the reticle stage 25 and wafer stage 45. Based on the detection result obtained by the wafer alignment detection system 80, the control unit 90 drives the wafer stage 45 in the X- and Y-axis directions to adjust the position of the wafer 40 in the X- and Y-axis directions. Moreover, the control unit 90 controls adjustment processing of position detection apparatuses such as the wafer alignment detection system 80 (to be described later).

Figure 3:
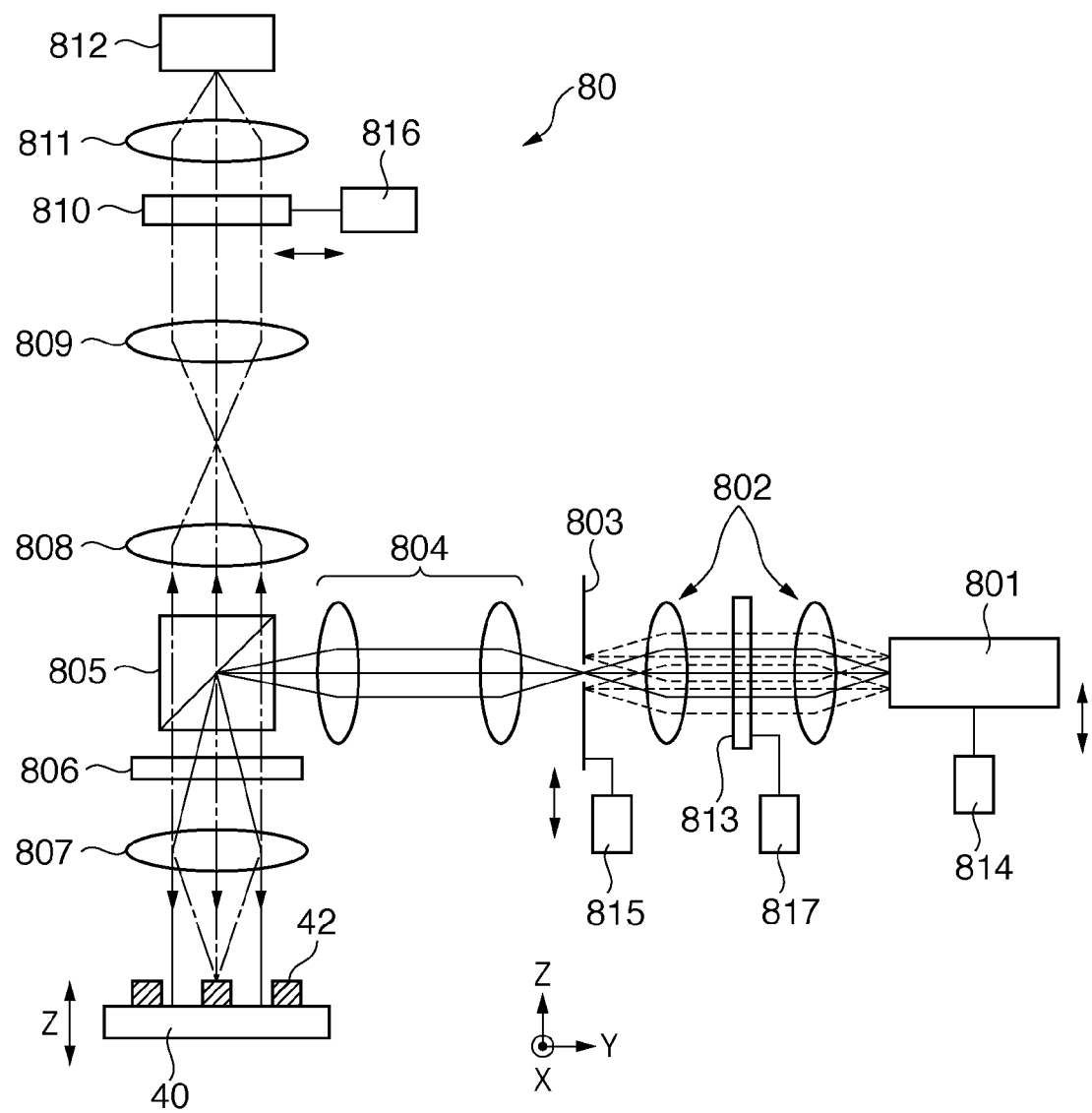
FIG. 3 is a schematic sectional view showing the detailed arrangement of a wafer alignment detection system of the exposure apparatus shown in FIG. 1.

The wafer alignment detection system 80 will be explained in detail with reference to FIG. 3. FIG. 3 is a schematic sectional view showing the detailed arrangement of the wafer alignment detection system 80. In this embodiment, the wafer alignment detection system 80 includes an illumination light source 801, relay optical system 802, aperture stop 803, illumination system 804, polarizing beam splitter 805, λ/4 plate 806, and objective lens 807. The illumination light source 801 includes, for example, a fiber. The wafer alignment detection system 80 also includes a relay lens 808, a first imaging optical system 809, an optical member 810 for adjusting coma aberration, a second imaging optical system 811, a photoelectric conversion device 812, a wavelength selection mechanism 813, and driving units 814 to 817. The wavelength selection mechanism 813 is formed from, for example, a plurality of filters which pass light components with different wavelength ranges, and has a function of passing only a light component which is emitted by the illumination light source 801 and has a predetermined wavelength (i.e., selecting the wavelength of a light component to pass). The driving unit 814 drives the illumination light source 801 (more specifically, the light beam exit port of the illumination light source 801) in a direction perpendicular to the optical axis of an optical system (including, e.g., the relay optical system 802 and illumination system 804 in this embodiment) of the wafer alignment detection system 80 under the control of the control unit 90. The driving unit 815 drives the aperture stop 803 (more specifically, the aperture of the aperture stop 803) in a direction perpendicular to the optical axis of an optical system (including, e.g., the relay optical system 802 and illumination system 804 in this embodiment) of the wafer alignment detection system 80 under the control of the control unit 90. The driving unit 815 also has a function of changing the aperture diameter of the aperture stop 803 and switching from the aperture stop 803 to other aperture stops (i.e., aperture stops with different illumination σ values). This makes it possible to change the illumination σ value with which the wafer alignment detection system 80 illuminates the alignment mark as the detection target. The driving unit 816 drives the optical member 810 in a direction perpendicular to the optical axis of an optical system (including, e.g., the relay lens 808, first imaging optical system 809, and second imaging optical system 811 in this embodiment) of the wafer alignment detection system 80 under the control of the control unit 90. In this manner, the driving units 814 to 816 can change the positions of the illumination light source 801, aperture stop 803, and optical member 810. The driving unit 817 has a function of switching between the plurality of filters of the wavelength selection mechanism 813 under the control of the control unit 90. This makes it possible to select a wavelength range, in which the contrast of the detection waveform is highest, for each wafer process. Any arrangement known to those skilled in the art is applicable to each of the driving units 814 to 817. Although the wafer alignment detection system 80 according to this embodiment includes the optical axis of an optical system including the illumination light source 801 to illumination system 804 and wavelength selection mechanism 813, and that of an optical system including the polarizing beam splitter 805 to photoelectric conversion device 812, they are collectively referred to as the optical axis hereinafter.

Figure 4:
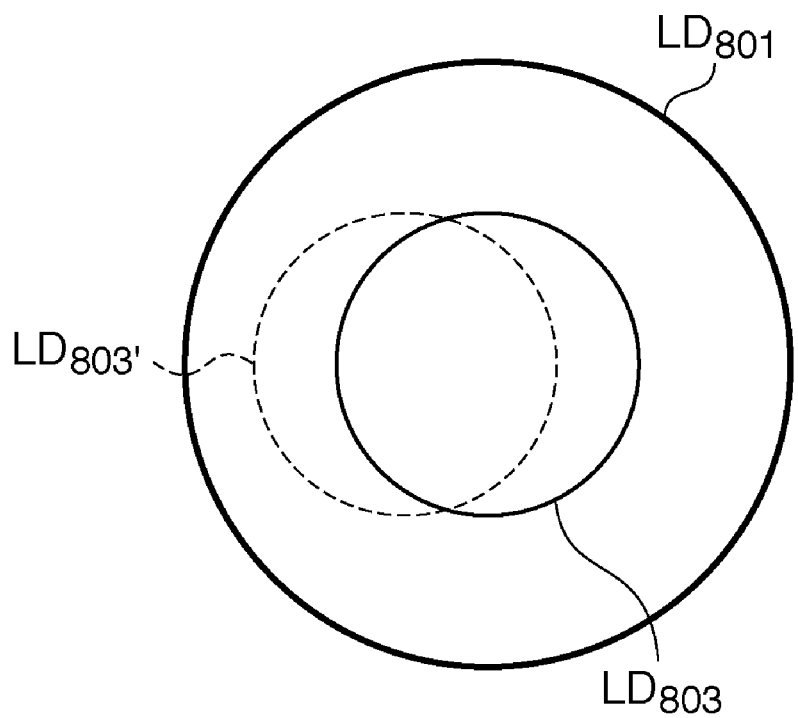
FIG. 4 is a view showing the relationship between the beam diameter in an illumination light source and that in an aperture stop in the wafer alignment detection system shown in FIG. 3.

Referring to FIG. 3, a light beam emitted by the illumination light source 801 reaches the aperture stop 803 inserted on the pupil plane (the optical Fourier transformation plane with respect to the object plane) of the wafer alignment detection system 80, via the relay optical system 802 and wavelength selection mechanism 813. As shown in FIG. 4, a beam diameter $LD_{803}$ in the aperture stop 803 is sufficiently smaller than a beam diameter $LD_{801}$ in the illumination light source 801. Note that FIG. 4 is a view showing the relationship between the beam diameter $LD_{801}$ in the illumination light source 801 and the beam diameter $LD_{803}$ in the aperture stop 803.

The light beam which has reached the aperture stop 803 is guided to the polarizing beam splitter 805 via the illumination system 804. Of the light beam guided to the polarizing beam splitter 805, an S-polarized light component perpendicular to the paper surface is reflected by the polarizing beam splitter 805 and is converted into a circularly polarized light beam upon passing through the λ/4 plate 806. The light beam having passed through the λ/4 plate 806 Kohler-illuminates, via the objective lens 807, a wafer alignment mark 42 formed on the wafer 40.

Reflected light, diffracted light, and scattered light from the wafer alignment mark 42 are converted into a P-polarized light beam parallel to the paper surface upon passing through the λ/4 plate 806 via the objective lens 807, and the P-polarized light beam passes through the polarizing beam splitter 805. The light beam having passed through the polarizing beam splitter 805 forms an image of the wafer alignment mark 42 on the photoelectric conversion device 812 via the relay lens 808, first imaging optical system 809, optical member 810, and second imaging optical system 811.

The wafer alignment detection system 80 detects the position of the wafer 40 based on the waveform of a detection signal of the wafer alignment mark 42, which is photoelectrically converted by the photoelectric conversion device 812.

When the wafer alignment detection system 80 detects the wafer alignment mark 42 on the wafer 40 with monochromatic light, an interference pattern is generated because a resist (transparent layer) is applied (formed) on the wafer alignment mark 42. This makes it impossible to detect the wafer alignment mark 42 with high accuracy because the interference pattern signal is added to the detection signal (alignment signal) output from the photoelectric conversion device 812. To solve this problem, this embodiment uses a light source with a relatively wide wavelength range as the illumination light source 801 to prevent the interference pattern signal from being added to the detection signal from the photoelectric conversion device 812.

To detect the wafer alignment mark 42 on the wafer 40 with high accuracy, it is also necessary to clearly detect an image of the wafer alignment mark 42. In other words, the wafer alignment detection system 80 needs to be focused on the wafer alignment mark 42. For this purpose, the wafer alignment detection system 80 in this embodiment includes an AF detection system (not shown), and drives the wafer alignment mark 42 to a best focus position based on the detection result obtained by the AF detection system, thereby detecting the wafer alignment mark 42.

Although the wafer alignment detection system 80 is the off-axis detection system in this embodiment, it may be the TTL-AA detection system. When the wafer alignment detection system 80 is the TTL-AA detection system, it detects the wafer alignment mark 42 via the projection optical system 30 with the same basic arrangement as that of the off-axis detection system.

Figure 5:
FIG. 5 is a schematic sectional view showing an example of a wafer dedicated to adjustment of coma aberration of an optical system of the wafer alignment detection system of the exposure apparatus shown in FIG. 1.

The adjustment of coma aberration of the optical system of the wafer alignment detection system 80 will be explained herein. To adjust coma aberration of the optical system of the wafer alignment detection system 80, it is necessary to use a wafer dedicated to adjustment, which includes a step DL on its silicon (Si) surface as shown in FIG. 5. The adjustment wafer is not accommodated in the exposure apparatus 1 but is conveyed from the outside of the exposure apparatus 1 (wafer alignment detection system 80). Note that FIG. 5 is a schematic sectional view showing an example of the adjustment wafer used to adjust coma aberration of the optical system of the wafer alignment detection system 80.

Figure 6:
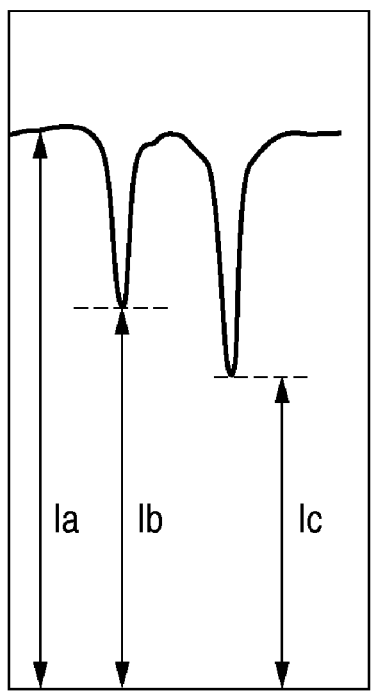
FIG. 6 is a chart showing an example of a detection waveform (asymmetrical waveform) when the wafer alignment detection system has detected the wafer dedicated to adjustment, which is shown in FIG. 5.

For example, assume that an asymmetrical detection waveform as shown in FIG. 6 has been obtained by detecting (illuminating) the wafer dedicated to adjustment, which is shown in FIG. 5, by the wafer alignment detection system 80 with an illumination σ value of 0.9, when the step DL of the wafer dedicated to adjustment is set to λ/8 where λ is the wavelength of a light beam from the illumination light source 801. The asymmetry of the detection waveform shown in FIG. 6 occurs due to coma aberration and an optical axis shift of the optical system of the wafer alignment detection system 80. However, this embodiment assumes that the asymmetry has occurred due to only coma aberration of the optical system of the wafer alignment detection system 80.

Figure 7:
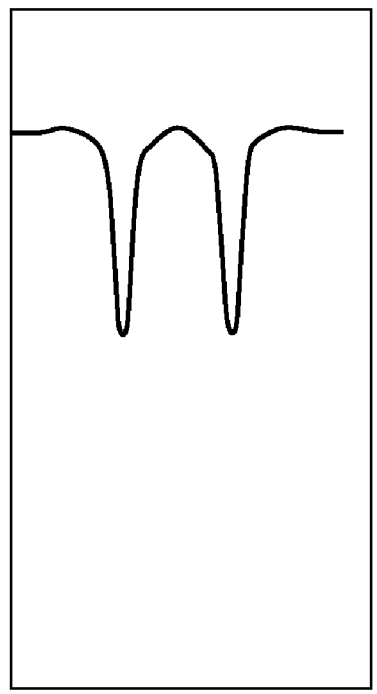
FIG. 7 is a chart showing an example of a detection waveform (symmetrical waveform) when the wafer alignment detection system has detected the wafer dedicated to adjustment, which is shown in FIG. 5.

To convert the asymmetrical detection waveform as shown in FIG. 6 into a symmetrical detection waveform as shown in FIG. 7, the optical member 810 is driven in a direction perpendicular to the optical axis via the driving unit 816 and adjust coma aberration of the overall optical system of the wafer alignment detection system 80. More specifically, the optical member 810 is driven in a direction perpendicular to the optical axis until the asymmetrical detection waveform shown in FIG. 6 is converted into the symmetrical detection waveform shown in FIG. 7. Note that FIG. 7 is a chart showing an example of a detection waveform when the wafer alignment detection system 80 has detected the wafer dedicated to adjustment, which is shown in FIG. 5.

In this manner, coma aberration of the optical system of the wafer alignment detection system 80 can be adjusted by driving the optical member 810 in a direction perpendicular to the optical axis of the optical system of the wafer alignment detection system 80.

Figure 8:
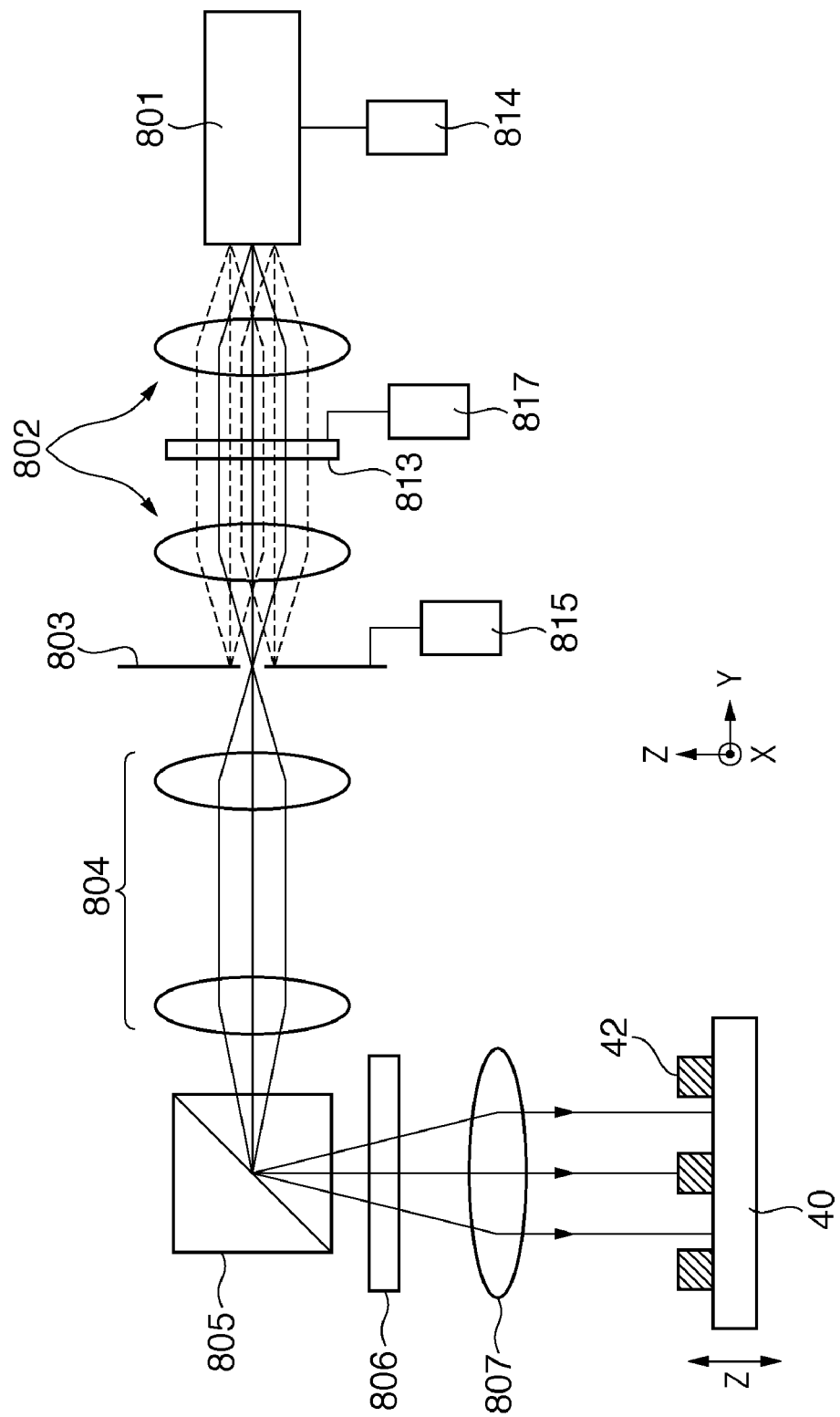
FIG. 8 is a schematic sectional view illustrating a case in which the optical system of the wafer alignment detection system shown in FIG. 3 has no optical axis shift.

The adjustment of an optical axis shift of the optical system of the wafer alignment detection system 80 will be explained next. If the optical system of the wafer alignment detection system 80 has no optical axis shift as shown in FIG. 8, the principal ray of a light beam from the illumination light source 801 vertically enters the wafer 40 (wafer alignment mark 42). In this case, the symmetrical detection waveform as shown in FIG. 7 is obtained as long as coma aberration of the optical system of the wafer alignment detection system 80 is adjusted perfectly. FIG. 8 is a schematic sectional view illustrating a case in which the optical system of the wafer alignment detection system 80 has no optical axis shift.

Figure 9:
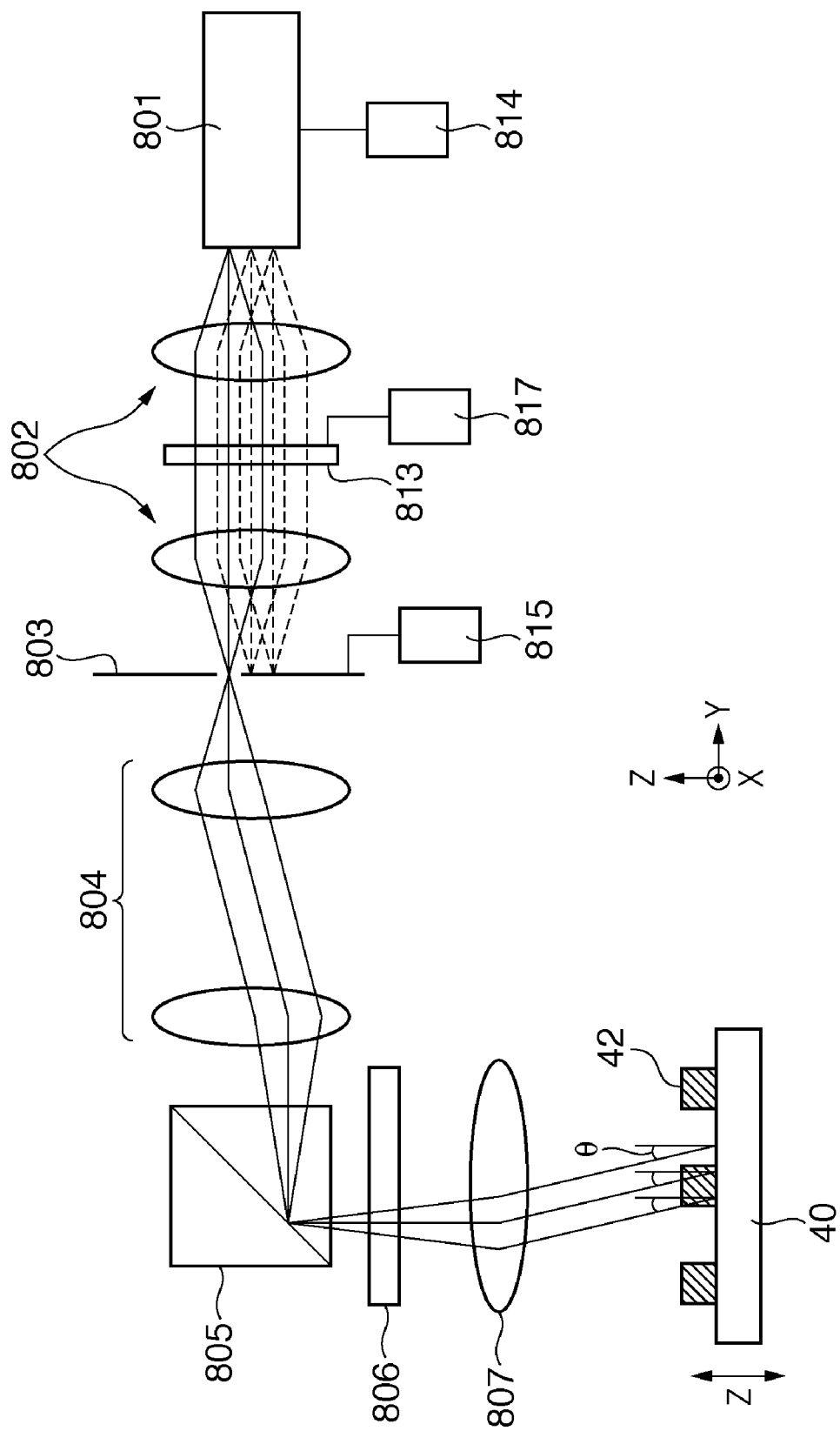
FIG. 9 is a schematic sectional view illustrating a case in which the optical system of the wafer alignment detection system shown in FIG. 3 has an optical axis shift.

If the aperture stop 803 of the wafer alignment detection system 80 is shifted with respect to the optical axis as shown in FIG. 9, the principal ray of a light beam from the illumination light source 801 enters the wafer 40 not vertically but obliquely (with an angle θ). As shown in FIG. 4, the center position of a beam diameter $LD_{803}'$ in the aperture stop 803 is shifted with respect to that of the beam diameter $LD_{801}$ in the illumination light source 801. This state will be referred to as "the optical system has an optical axis shift" hereinafter. In this case, even when coma aberration of the optical system of the wafer alignment detection system 80 is adjusted perfectly, the asymmetrical detection waveform as shown in FIG. 6 is obtained by the wafer alignment detection system 80. Note that FIG. 9 is a schematic sectional view illustrating a case in which the wafer alignment detection system 80 has an optical axis shift.

In this embodiment, as shown in FIG. 9, an optical axis shift of the optical system of the wafer alignment detection system 80 has been explained by taking a position shift of the aperture stop 803 as an example. However, an optical axis shift of the optical system of the wafer alignment detection system 80 occurs even due to, for example, a position shift of the illumination light source 801. When the optical system of the wafer alignment detection system 80 has an optical axis shift, it generates an asymmetrical detection waveform. This results in detection errors as in the case in which the optical system of the wafer alignment detection system 80 has coma aberration.

When the optical system of the wafer alignment detection system 80 has an optical axis shift, the illumination light source 801 or aperture stop 803 is driven in a direction perpendicular to the optical axis via the driving unit 814 or 815 and adjust the optical axis shift of the optical system of the wafer alignment detection system 80. More specifically, the optical axis shift of the optical system of the wafer alignment detection system 80 is adjusted using the defocus characteristic as an index of an optical axis shift of the optical system of the wafer alignment detection system 80.

Figure 10:
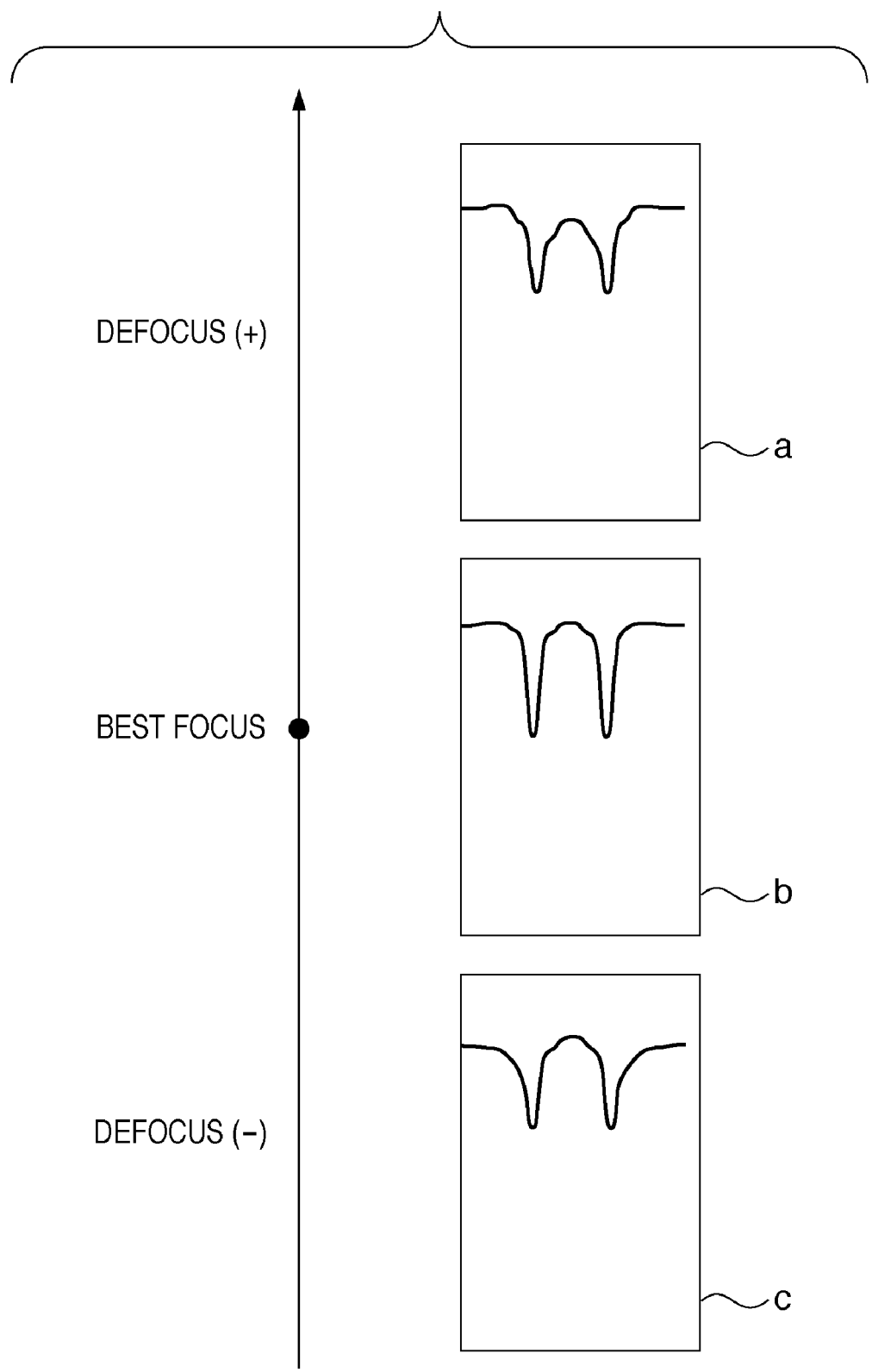
FIG. 10 shows charts of detection waveforms obtained when an alignment mark has been detected in an ideal state in which the optical system of the wafer alignment detection system has neither coma aberration nor optical axis shift.

The defocus characteristic will be explained with reference to FIGS. 10 to 13. To acquire the defocus characteristic, an alignment mark formed from a chromium pattern is detected while being defocused. The alignment mark is formed on, for example, the stage reference plate 50, and the exposure apparatus 1 can easily acquire the defocus characteristic.

b in FIG. 10 shows a detection waveform obtained when the alignment mark formed at a best focus position has been detected in an ideal state in which the optical system of the wafer alignment detection system 80 has neither coma aberration nor optical axis shift. a in FIG. 10 shows a detection waveform obtained by defocusing the detection waveform shown in b of FIG. 10 in the plus (+) direction (i.e., by defocusing the alignment mark in the plus direction from the state shown in b of FIG. 10). c in FIG. 10 shows a detection waveform obtained by defocusing the detection waveform shown in b of FIG. 10 in the minus (−) direction (i.e., by defocusing the alignment mark in the minus direction from the state shown in b of FIG. 10. Note that FIG. 10 shows charts of detection waveforms obtained when the alignment mark has been detected in an ideal state in which the optical system of the wafer alignment detection system 80 has neither coma aberration nor optical axis shift.

Although the detection waveforms shown in a and c of FIG. 10 have contrasts decreased from that of the detection waveform shown in b of FIG. 10, their detection waveform symmetries do not deteriorate because the optical system of the wafer alignment detection system 80 has neither coma aberration nor optical axis shift. Hence, the center positions (i.e., the center positions of the detection waveforms shown in a and c of FIG. 10) of the alignment mark, which are detected from the detection waveforms shown in a and c of FIG. 10, are the same as that of the alignment mark, which is detected from the detection waveform shown in b of FIG. 10.

Figure 11:
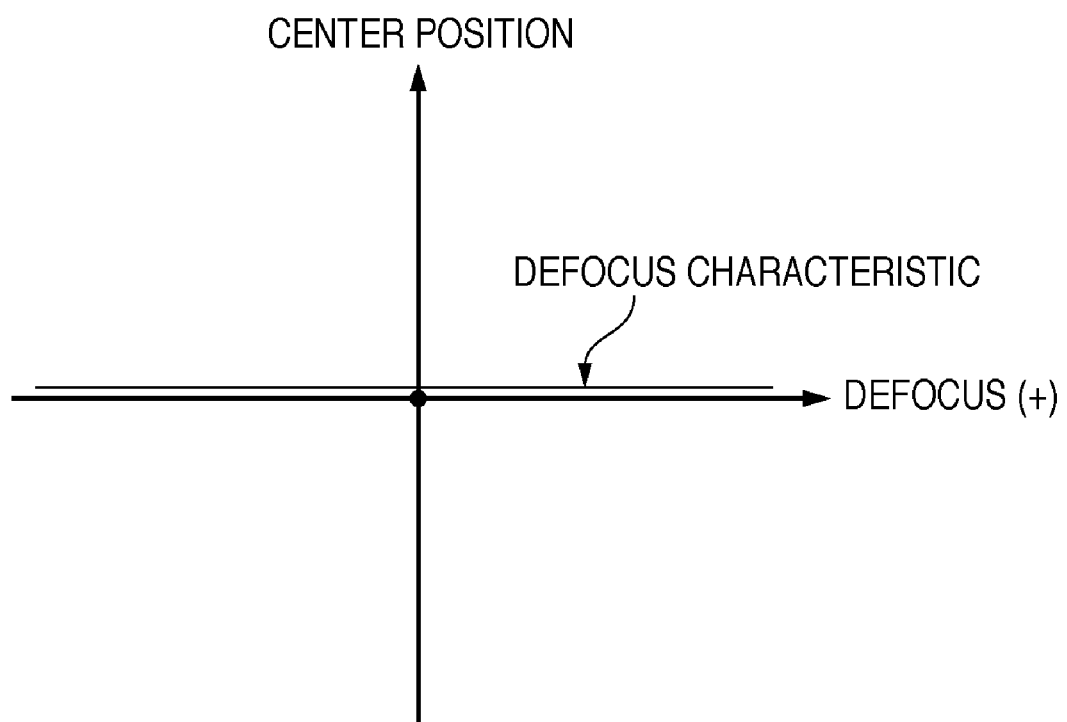
FIG. 11 is a graph showing the center positions of the detection waveforms shown in FIG. 10 with respect to the defocus.

FIG. 11 is a graph showing the center positions of the detection waveforms shown in FIG. 10 with respect to the defocus. As shown in FIG. 11, the center positions of the detection waveforms shown in FIG. 10 take a constant value independently of the defocus. The slope of the center position of the detection waveform with respect to the defocus represents the defocus characteristic. The defocus characteristic in FIG. 11 is zero. Even when the alignment mark is defocused upon wafer alignment (i.e., upon detecting the alignment mark), no shift (detection error) in the center position of the detection waveform occurs as long as the center position of the detection waveform does not change with respect to the defocus.

b in FIG. 12 shows a detection waveform obtained when the alignment mark formed at a best focus position has been detected while coma aberration and an optical axis shift remain in the optical system of the wafer alignment detection system 80 although the coma aberration is adjusted so that the detection waveform becomes symmetrical. a in FIG. 12 shows a detection waveform obtained by defocusing the detection waveform shown in b of FIG. 12 in the plus (+) direction (i.e., by defocusing the alignment mark in the plus direction from the state shown in b of FIG. 12). c in FIG. 12 shows a detection waveform obtained by defocusing the detection waveform shown in b of FIG. 12 in the minus (−) direction (i.e., by defocusing the alignment mark in the minus direction from the state shown in b of FIG. 12). Note that FIG. 12 shows charts of detection waveforms obtained when the alignment mark has been detected while coma aberration and an optical axis shift remain in the optical system of the wafer alignment detection system 80 although the coma aberration is adjusted so that the detection waveform becomes symmetrical.

The detection waveforms shown in a and c of FIG. 12 not only have contrasts decreased from that of the detection waveform shown in b of FIG. 12 but also are asymmetrical due to the influence of an optical axis shift of the optical system of the wafer alignment detection system 80.

Figure 13:
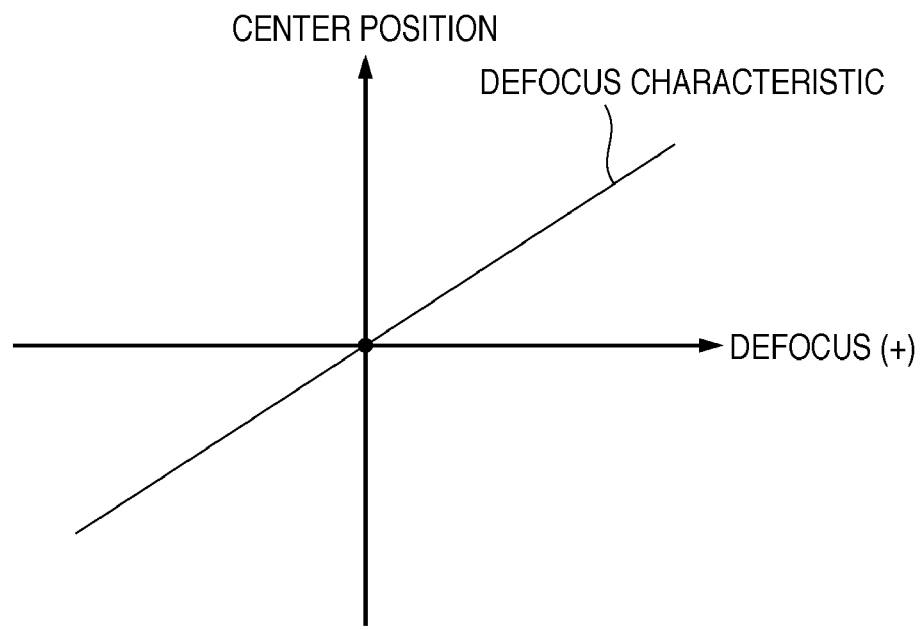
FIG. 13 is a graph showing the center positions of the detection waveforms shown in FIG. 12 with respect to the defocus.

FIG. 13 is a graph showing the center positions of the detection waveforms shown in FIG. 12 with respect to the defocus. Referring to FIG. 13, the center position of the detection waveform takes a value (i.e., a value which changes with respect to the defocus) which depends on the defocus. As described above, the slope of the center position of the detection waveform with respect to the defocus represents the defocus characteristic. The defocus characteristic in FIG. 13 takes a nonzero value. As shown in FIG. 13, when the center position of the detection waveform changes with respect to the defocus, no shift in the center position of the detection waveform occurs at a best focus position. However, a little defocus occurs upon wafer alignment in practice, resulting in a position shift. To adjust an optical axis shift of the optical system of the wafer alignment detection system 80, the illumination light source 801 or aperture stop 803 is driven in a direction perpendicular to the optical axis of the optical system of the wafer alignment detection system 80 based on the defocus characteristic.

A method of adjusting coma aberration and an optical axis shift of the optical system of the wafer alignment detection system 80 will be explained. A method of adjusting the wafer alignment detection system 80 according to the prior art will be explained before an explanation of a method of adjusting the wafer alignment detection system 80 according to this embodiment.

In the method of adjusting the wafer alignment detection system 80 according to the prior art, a wafer dedicated to adjustment, as shown in FIG. 5, is conveyed from the outside of the exposure apparatus 1 first. Using the wafer dedicated to adjustment, coma aberration of the optical system of the wafer alignment detection system 80 is adjusted. A defocus characteristic is then acquired using an alignment mark formed from a chromium pattern on the stage reference plate 50. An optical axis shift of the optical system of the wafer alignment detection system 80 is adjusted so that the defocus characteristic becomes zero.

However, the method of adjusting the wafer alignment detection system 80 according to the prior art poses two problems. The first problem is that an optical axis shift amount at which the defocus characteristic becomes zero is different from that at which the detection waveform becomes symmetrical. For this reason, when an optical axis shift of the optical system is adjusted so that the defocus characteristic becomes zero, the detection waveform symmetry deteriorates, resulting in detection errors. The second problem is that when a new wavelength range is additionally set for the wafer alignment detection system 80 on the exposure apparatus 1, and an optical axis shift is adjusted so that the defocus characteristic satisfies a specification in this wavelength range, the detection waveform symmetry deteriorates, resulting in detection errors.

Figure 14:
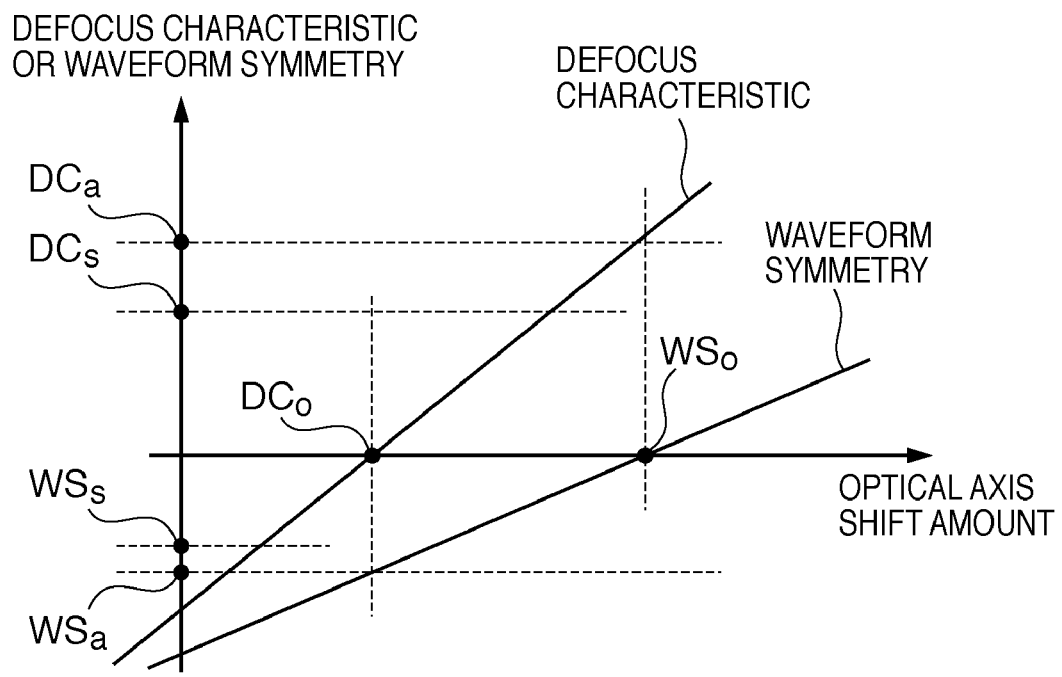
FIG. 14 is a graph showing changes in detection waveform symmetry and defocus characteristic with respect to an optical axis shift (optical axis shift amount) of the optical system of the wafer alignment detection system.

The problems of the method of adjusting the wafer alignment detection system 80 according to the prior art will be explained in detail. FIG. 14 is a graph showing changes in detection waveform symmetry and defocus characteristic with respect to an optical axis shift (optical axis shift amount) of the optical system of the wafer alignment detection system 80. Referring to FIG. 14, the ordinate indicates the defocus characteristic or waveform symmetry, and the abscissa indicates the optical axis shift amount. As shown in FIG. 6, the waveform symmetry herein is defined by (Ib−Ic)/Ia [%] where Ia is the base intensity of the detection waveform, and Ib and Ic are the intensities of the edge portions of the detection waveform.

Since the detection waveform can be symmetrized by adjusting coma aberration of the optical system of the wafer alignment detection system 80, the waveform symmetry can be set to nearly zero as indicated by a point $WS_0$ in FIG. 14. However, when coma aberration or an optical axis shift remain in the optical system of the wafer alignment detection system 80, the defocus characteristic may take a certain value, which exceeds a specification $DC_s$ of the defocus characteristic, as indicated by a point $DC_a$ in FIG. 14. In other words, the defocus characteristic may not satisfy a specification although the detection waveform symmetry satisfies a specification. According to the prior art, to satisfy the specification of the defocus characteristic, an optical axis shift of the optical system of the wafer alignment detection system 80 is adjusted so that the defocus characteristic becomes zero as indicated by a point $DC_0$ in FIG. 14. Although the defocus characteristic is set to zero by adjusting the optical axis shift, the detection waveform symmetry deteriorates. For this reason, the defocus characteristic may take a certain value, which exceeds a specification $WS_s$ of the defocus characteristic, as indicated by a point $WS_a$ in FIG. 14.

Figure 15:
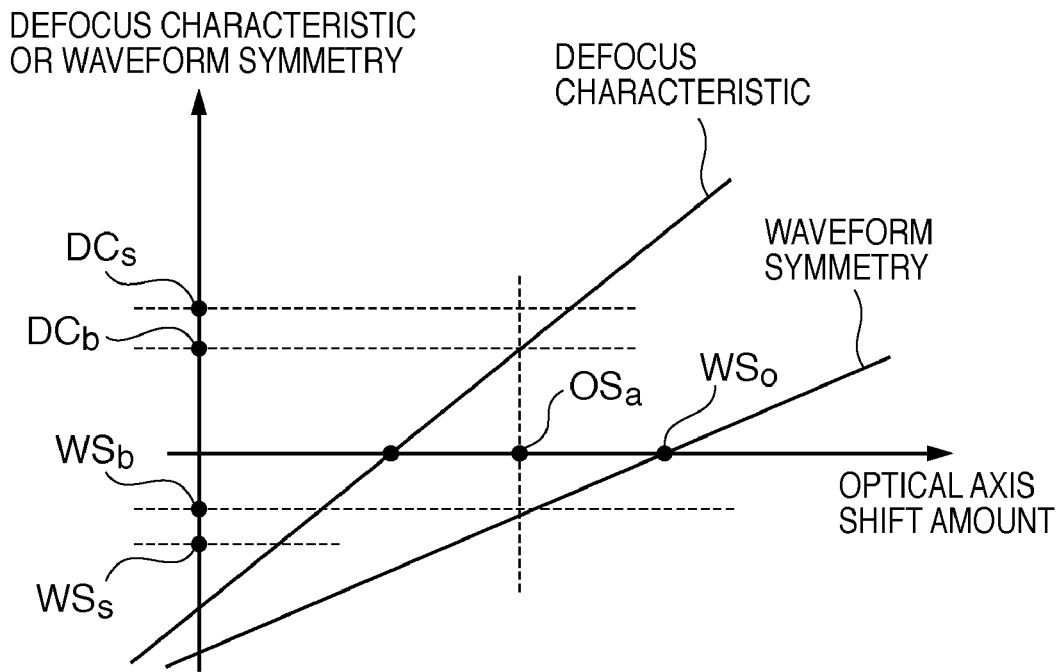
FIG. 15 is a graph showing changes in detection waveform symmetry and defocus characteristic with respect to an optical axis shift (optical axis shift amount) of the optical system of the wafer alignment detection system according to this embodiment.

To avoid this situation, this embodiment uses a waveform symmetry stored (acquired) in a memory (not shown) of the control unit 90 in advance to adjust the wafer alignment detection system 80, as shown in FIG. 15. In other words, a feature of this embodiment lies in that the control unit 90 has in advance the waveform symmetry information with respect to the optical axis shift amount of the optical system of the wafer alignment detection system 80 as shown in FIG. 15. As described above, the waveform symmetry information is acquired using the wafer dedicated to adjustment, which has the step DL on its silicon surface shown in FIG. 5. Note that FIG. 15 is a graph showing changes in detection waveform symmetry and defocus characteristic with respect to an optical axis shift (optical axis shift amount) of the optical system of the wafer alignment detection system 80 according to this embodiment.

As described above, the waveform symmetry can be set to zero (the point $WS_0$ in FIG. 14) at the stage of adjusting coma aberration of the optical system of the wafer alignment detection system 80. In this state, however, the defocus characteristic (the point $DC_a$ in FIG. 14) does not satisfy the specification (the point $DC_s$ in FIG. 14) of the defocus characteristic. To solve this problem, the optical axis shift amount of the wafer alignment detection system 80 is adjusted so that the defocus characteristic satisfies its specification. Note that the waveform symmetry does not satisfy its specification if the optical axis shift amount is adjusted until the defocus characteristic becomes zero (the point $DC_0$ in FIG. 14).

In this embodiment, using waveform symmetry information acquired in advance, an optical axis shift of the wafer alignment detection system 80 is adjusted so that the waveform symmetry satisfies the specification $WS_s$ as indicated by a point $OS_a$ in FIG. 15. When the optical axis shift amount to be adjusted is the one indicated by the point $OS_a$ in FIG. 15, the defocus characteristic takes a value as indicated by a point $DC_b$ in FIG. 15, which satisfies the specification $DC_s$ of the defocus characteristic, and the waveform symmetry takes a value indicated by a point $WS_b$ in FIG. 15, which satisfies the specification $WS_s$ of the waveform symmetry.

An explanation that an optical axis shift of the optical system of the wafer alignment detection system 80 need only be adjusted so that the optical axis shift amount (the point $OS_a$ in FIG. 15) which satisfies the specifications of the waveform symmetry and defocus characteristic is obtained has been given with reference to FIG. 15. More specifically, the optical axis shift amount of the optical system of the wafer alignment detection system 80 is preferably adjusted to be the middle point between an optical axis shift amount which satisfies the threshold value of the specification of the defocus characteristic and that which satisfies the threshold value of the specification of the waveform symmetry.

Figure 16:
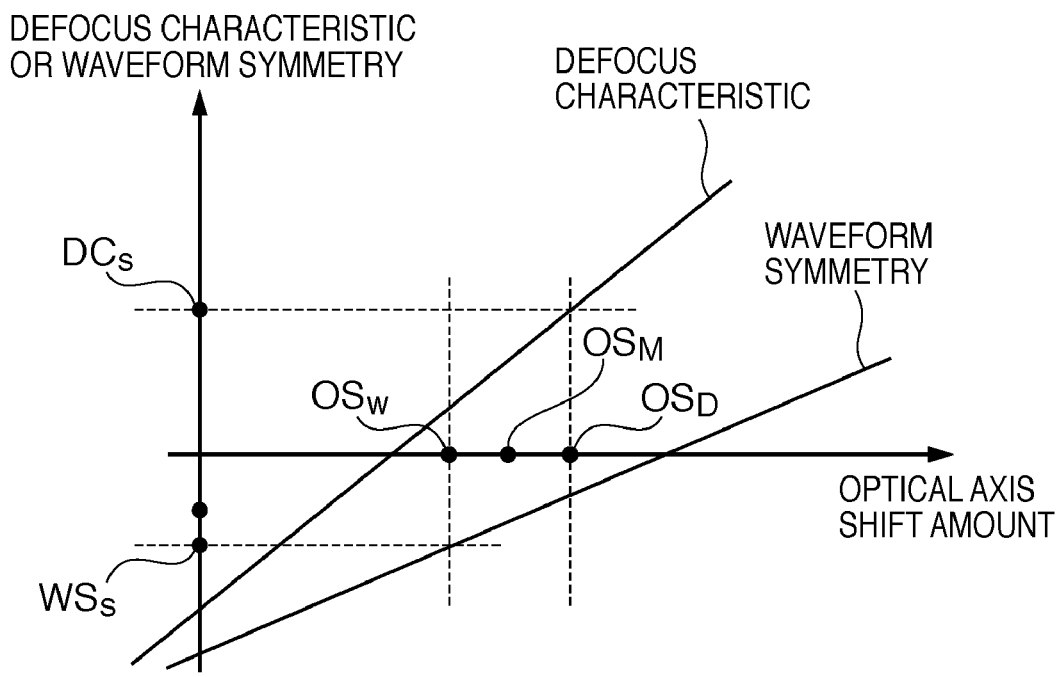
FIG. 16 is a graph showing changes in detection waveform symmetry and defocus characteristic with respect to an optical axis shift (optical axis shift amount) of the optical system of the wafer alignment detection system according to this embodiment.

As shown in FIG. 16, assume that an optical axis shift amount which satisfies the threshold value of the specification of the defocus characteristic takes a value indicated by a point $OS_D$, and that which satisfies the threshold of the specification of the waveform symmetry takes a value indicated by a point $OS_W$. In this case, an optical axis shift of the optical system of the wafer alignment detection system 80 is adjusted to have an amount indicated by a point $OS_M$, that is, the middle point between the optical axis shift amount indicated by the point $OS_D$ and that indicated by the point $OS_W$. Note that FIG. 16 is a graph showing changes in detection waveform symmetry and defocus characteristic with respect to an optical axis shift (optical axis shift amount) of the optical system of the wafer alignment detection system 80 according to this embodiment.

In this embodiment, the wafer alignment detection system 80 can be adjusted so that the waveform symmetry (first evaluation value) and defocus characteristic (second evaluation value) satisfy their specifications (allowances). This allows the wafer alignment detection system 80 to reduce detection errors in wafer processes under various conditions. Consequently, the exposure apparatus 1 can perform accurate alignment for wafer processes under various conditions.

This embodiment has explained that an optical axis shift of the optical system of the wafer alignment detection system 80 is adjusted to have an amount equal to the middle point between an optical axis shift amount which satisfies the threshold value of the specification of the defocus characteristic and that which satisfies the threshold value of the specification of the waveform symmetry. However, an optical axis shift amount to adjust the wafer alignment detection system 80 may be determined by weighting at least one of the waveform symmetry and the defocus characteristic. For example, if the weighting ratio between the defocus characteristic and the waveform symmetry is 7:3, the wafer alignment detection system 80 is adjusted so that the optical axis shift amount becomes (0.7×(the optical axis shift amount indicated by the point $OS_D$)+0.3×(the optical axis shift amount indicated by the point $OS_W$)). In this manner, it is also possible to adjust an optical axis shift of the optical system of the wafer alignment detection system 80 by weighting at least one of the defocus characteristic and the waveform symmetry in accordance with the required alignment (mark detection) accuracy.

The defocus characteristic and waveform symmetry sometimes satisfy their specifications without adjusting an optical axis shift of the optical system of the wafer alignment detection system 80. In this case, since the wafer alignment detection system 80 can exhibit a desired performance, there is no need to adjust an optical axis shift of the optical system of the wafer alignment detection system 80. In other words, when coma aberration of the optical system of the wafer alignment detection system 80 is adjusted so that the optical axis shift amount of the optical system of the wafer alignment detection system 80 falls within the range between the points $OS_W$ and $OS_D$, the waveform symmetry and defocus characteristic satisfy their specifications. This obviates the need to adjust an optical axis shift of the optical system of the wafer alignment detection system 80.

Figure 17:
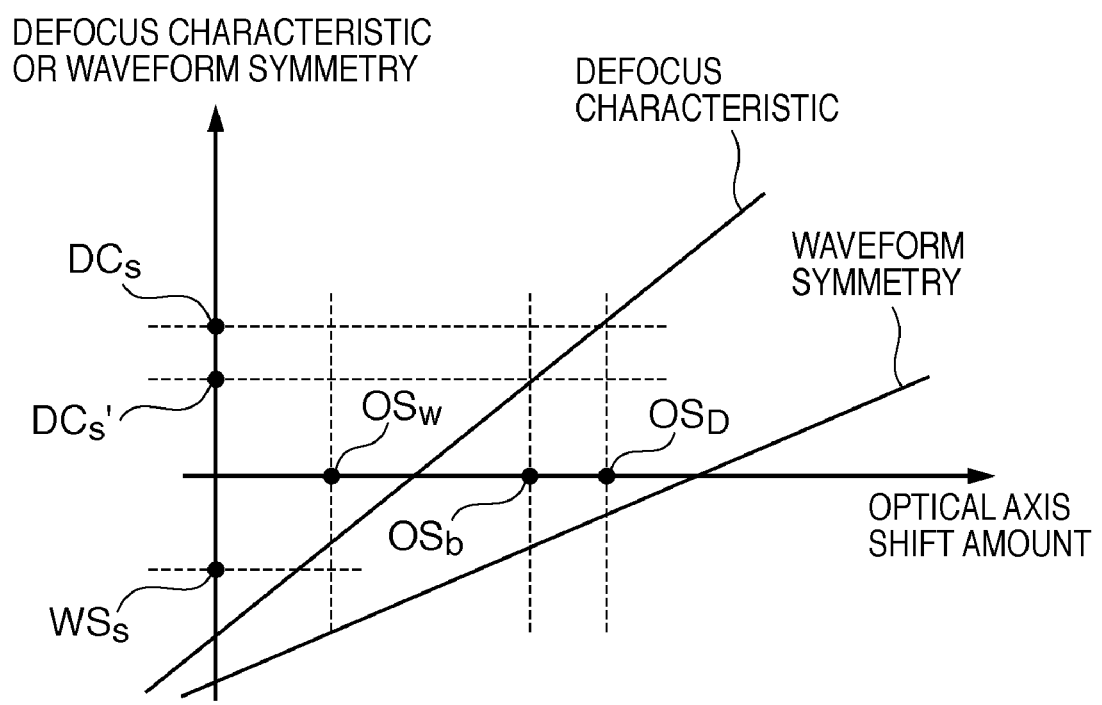
FIG. 17 is a graph showing changes in detection waveform symmetry and defocus characteristic with respect to an optical axis shift (optical axis shift amount) of the optical system of the wafer alignment detection system according to this embodiment.

It is also possible to change the specifications of the waveform symmetry and defocus characteristic via a setting unit which is provided to the exposure apparatus 1 and set the specifications of the waveform symmetry and defocus characteristic. In other words, it is possible to change the adjustment range (the adjustment range of the optical axis shift amount) of an optical axis shift of the optical system of the wafer alignment detection system 80. For example, as shown in FIG. 17, when the specification of the defocus characteristic changes from $DC_s$ to $DC_s'$, an optical axis shift amount which satisfies the threshold value of the specification $DC_s'$ of the defocus characteristic is the one indicated by a point $OS_b$. In this case, an optical axis shift amount which satisfies the specification $WS_s$ of the waveform symmetry and the specification $DC_s'$ of the defocus characteristic falls within the range between the points $OS_W$ and $OS_b$, which is narrower than the range (between the points $OS_W$ and $OS_D$) shown in FIG. 16. This makes it possible to adjust the wafer alignment detection system 80 with a higher accuracy. Note that FIG. 17 is a graph showing changes in detection waveform symmetry and defocus characteristic with respect to an optical axis shift (optical axis shift amount) of the optical system of the wafer alignment detection system 80 according to this embodiment.

Although this embodiment has exemplified the range of the optical shift amount when the specification of the defocus characteristic is changed, the specification of the waveform symmetry may be changed. Even when the specification of the waveform symmetry is changed, the range of the optical axis shift amount can be changed, thus adjusting the wafer alignment detection system 80 with a higher accuracy.

This embodiment is also applicable to the adjustment (especially for an optical axis shift) of the wafer alignment detection system 80 when a new wavelength range or illumination σ value is additionally set for the wafer alignment detection system 80 on the exposure apparatus 1. For example, assume that a new illumination condition is additionally set for the wafer alignment detection system 80. In this case, the wafer alignment detection system 80 needs to be adjusted under the new illumination condition because an optical axis shift of the optical system of the wafer alignment detection system 80 is not adjusted under the new illumination condition.

As described above, according to the prior art, an optical axis shift of the optical system of the wafer alignment detection system 80 is adjusted so that the defocus characteristic becomes close to zero under a new illumination condition, but the waveform symmetry sometimes does not satisfy its specification even when the defocus characteristic becomes zero. This results in detection errors, which make it impossible to perform accurate alignment for wafer processes under various conditions.

As in this embodiment, when the control unit 90 has in advance the waveform symmetry information with respect to the optical axis shift amount of the optical system of the wafer alignment detection system 80 under a new illumination condition, the wafer alignment detection system 80 can be adjusted so that the waveform symmetry and defocus characteristic satisfy their specifications. Consequently, even when a new illumination condition is additionally set for the wafer alignment detection system 80, accurate alignment can be done by reducing detection errors. That is, in this invention, the waveform symmetry information with respect to the optical axis shift amount of the optical system of the wafer alignment detection system 80 is acquired in advance for each of all illumination σ values in a widest wavelength range set for the wafer alignment detection system 80.

The relationship (i.e., information on the waveform symmetry and defocus characteristic as shown in FIGS. 15 to 17) of the waveform symmetry and defocus characteristic to the optical axis shift amount may be periodically updated. This makes it possible to adjust the wafer alignment detection system 80 (i.e., determine the adjustment range of the optical axis shift amount) by reflecting the current state of the wafer alignment detection system 80 on that relationship.

This embodiment is applicable not only to the adjustment of the wafer alignment detection system 80 but also to the adjustment of the reticle alignment detection system 70 or other position detection apparatuses.

In the operation of the exposure apparatus 1, the reticle alignment detection system 70 and wafer alignment detection system 80 are adjusted first. As described above, the reticle alignment detection system 70 and wafer alignment detection system 80 are adjusted so that the waveform symmetry and defocus characteristic satisfy their specifications.

Using the reticle alignment detection system 70 and wafer alignment detection system 80 which are adjusted so that the waveform symmetry and defocus characteristic satisfy their specifications, the reticle 20 and wafer 40 are aligned. Since the reticle alignment detection system 70 and wafer alignment detection system 80 can reduce detection errors in wafer processes under various conditions, the reticle 20 and wafer 40 can be aligned with high accuracy.

The pattern of the reticle 20 is transferred onto the wafer 40 by exposure. A light beam emitted by the light source 12 illuminates the reticle 20 via the illumination optical system 14. A light component reflecting the pattern of the reticle 20 forms an image on the wafer 40 via the projection optical system 30. Since the reticle 20 and wafer 40 are aligned with high accuracy, the pattern of the reticle 20 can be transferred onto the wafer 40 by exposure with high overlay accuracy. Hence, the exposure apparatus 1 can provide devices (e.g., a semiconductor device, an LCD device, an image sensing device (e.g., a CCD), and a thin-film magnetic head) with high throughput, high quality, and a good economical efficiency. These devices are fabricated by a step of exposing a substrate (e.g., a wafer or glass plate) coated with a resist (photosensitive agent) using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-180155 filed on Jul. 9, 2007, which is hereby incorporated by reference herein in its entirety.

What is claimed is:

1. An exposure apparatus comprising:
   a projection optical system configured to project a pattern of a reticle onto a substrate; and
   a position detection apparatus configured to detect at least one of a position of the reticle and a position of the substrate,
   said position detection apparatus including
   an optical system which includes an optical member whose position can be changed,
   a photoelectric conversion device configured to receive light from a mark to detect the position of the reticle and the position of the substrate via said optical system, and configured to output a detection signal, and
   a control unit configured to control the position of said optical member based on information on a first evaluation value representing a symmetry of a waveform of the detection signal at each of a plurality of positions of said optical member, and information on a second evaluation value representing a position shift of the mark detected upon changing a position of the mark in an optical axis direction of said optical system at each of the plurality of positions of said optical member,
   wherein said control unit includes the information on the first evaluation value in advance.

2. The apparatus according to claim 1, wherein said control unit controls the position of said optical member so that each of the first evaluation value and the second evaluation value satisfies an allowance.

3. The apparatus according to claim 2, further comprising a setting unit configured to set the allowance of the first evaluation value and the allowance of the second evaluation value.

4. The apparatus according to claim 2, wherein said control unit performs the control so that said optical member is positioned at the middle point between a position of said optical member, at which the first evaluation value satisfies the allowance, and a position of said optical member, at which the second evaluation value satisfies the allowance.

5. The apparatus according to claim 1, wherein said control unit controls the position of said optical member based on weighting amounts of the first evaluation and the second evaluation value.

6. The apparatus according to claim 1, wherein said optical member includes one of a light source configured to emit light to illuminate the mark, and an aperture stop inserted on a pupil plane of said optical system.

7. A device fabrication method comprising steps of:

exposing a substrate using an exposure apparatus according to claim 1; and performing a development process for the substrate exposed.

* * * * *